US008438433B2

(12) United States Patent
Rao et al.

(10) Patent No.: US 8,438,433 B2
(45) Date of Patent: May 7, 2013

(54) REGISTERS WITH FULL SCAN CAPABILITY

(75) Inventors: Hari M. Rao, San Diego, CA (US); Sei Seung Yoon, San Diego, CA (US); Nan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 298 days.

(21) Appl. No.: 12/886,620

(22) Filed: Sep. 21, 2010

(65) Prior Publication Data

US 2012/0072793 A1    Mar. 22, 2012

(51) Int. Cl.
*G11C 29/00*        (2006.01)

(52) U.S. Cl.
USPC ........................................................ 714/719

(58) Field of Classification Search .................. 714/719, 714/718, 726, 703, 733, 725, 758, 824
See application file for complete search history.

(56) References Cited

U.S. PATENT DOCUMENTS

| 4,158,240 | A | * | 6/1979 | Lewis et al. .................... 365/73 |
| 5,257,223 | A |   | 10/1993 | Dervisoglu |
| 5,265,045 | A |   | 11/1993 | Nishio et al. |
| 5,488,614 | A |   | 1/1996 | Shima |
| 5,504,756 | A |   | 4/1996 | Kim et al. |
| 5,668,490 | A |   | 9/1997 | Mitra et al. |
| 6,380,780 | B1 |   | 4/2002 | Aitken |
| 6,704,895 | B1 | * | 3/2004 | Swoboda et al. ............. 714/726 |
| 7,278,076 | B2 | * | 10/2007 | Zhang et al. .................. 714/726 |
| 7,345,505 | B2 |   | 3/2008 | Madurawe |
| 7,565,588 | B2 | * | 7/2009 | Nakashima et al. .......... 714/718 |
| 8,037,385 | B2 |   | 10/2011 | Rachapalli |
| 2004/0019830 | A1 |   | 1/2004 | Hosotani et al. |
| 2007/0130488 | A1 | * | 6/2007 | Nakashima et al. .......... 714/718 |
| 2007/0257898 | A1 | * | 11/2007 | Lee et al. ...................... 345/204 |

OTHER PUBLICATIONS

International Search Report and Written Opinion—PCT/US2011/052629—ISA/EPO—Dec. 21, 2011.

* cited by examiner

*Primary Examiner* — Fritz Alphonse
(74) *Attorney, Agent, or Firm* — Sam Talpalatsky; Nicholas J. Pauley; Joseph Agusta (57) ABSTRACT

A scan test of a first latch and a second latch couples a given scan value to the input of the first latch, to switch the first latch to a state corresponding to the scan value, uncouples the scan value from the first latch to latch the first latch at that state, couples the output of the first latch while latched at that state to the input of the second latch to switch the second latch to that state, and uncoupling the output of the first latch from the input of the second latch to latch the second latch at that state.

43 Claims, 5 Drawing Sheets

REGISTERS WITH FULL SCAN CAPABILITY

FIELD OF DISCLOSURE

The disclosure relates generally to built-in test of integrated circuit chips and, more particularly, to structures for built-in serial scan test.

BACKGROUND

Various functional classes of integrated circuits may be designed and implemented to have an operational mode and a test mode in which test data, typically a particular test bit pattern, is input to test input points within the circuit. The circuit is clocked to cause internal cells of the circuit to operate on the test data to generate a result, which the circuit designer makes observable through a corresponding test output point. The result is then compared to the correct result. If the comparison shows the result correct then the portion of the circuit between the test input point and the test output point has no faults.

One well-known test method, which is particularly appealing for testing integrated circuit chips having large numbers of single-bit latch-type storage cells, such as register files and other static random access memory (SRAM) devices, is called scan testing. Scan testing provides for control and observation of individual storage cells that, in response to control signals, switch their internal configuration and become connected to one another to form a chain, termed a "scan chain," of single-bit flip-flop type latches, extending from a designated input scan test cell to a designated output scan test cell. Storage cells having this capability are termed "scannable."

Ideally, if all of the scannable storage cells forming any given scan chain scan operate correctly in their normal operation then, after being reconfigured and connected into the scan chain, a scan test data fed to the input scan test cell will be shifted, in a bucket brigade manner, through each storage cell in the scan chain and, therefore will exit the scan test output cell uncorrupted. This assumes that the additional circuitry associated with each storage cell, which is necessary to make it scannable, operates correctly. Based on that same assumption, if the output scan test cell fails to output the same scan test sequence that was fed to the input scan test cell, failure is indicated as to any one of the storage cells in the scan chain extending from the input to the output of that scan chain.

Known methods of designing storage cells, including storage cells of register files, to be scannable necessarily include, with each storage cell, additional circuitry, such that scan testing is performed by control signals switching the topology of each of storage cell's circuitry from the normal level-triggered operation, i.e., latch mode, to an edge-triggered operation, i.e., flip-flop mode, and connecting the resulting flip-flop mode cells to one another, forming a chain of one-bit flip-flops. The register or other circuit that the storage cells form can then be scan tested by, for example, feeding a single bit test sequence to the data input of the chain's first storage cell/flip-flop, which may be the storage cell for either the least or most significant bit of the register when operating in its normal mode, and then, assuming an N-bit register, clocking all of the N storage cell/flip flops in the scan chain N or more times, shifting the scan test sequence through each, in a bucket-brigade manner and then observing the output of the last of the storage cell/flip/flops, which may be the storage cell for the other of the least or most significant bit of the register in normal operation.

A major benefit of scan test, which has been long known in the semiconductor memory industry, is that, at least ideally, it provides a means for observation and control of each storage cell switches into one of the scan chains when the circuit is switched into the test mode.

However, equally well known in the industry are the costs of the known methods of making scannable storage cells. One of these costs, which is significant, is the added transistor count and the corresponding additional interconnects. Related to this cost is the cost in chip area consumed by the additional circuitry.

The reason for such costs is that known methods make storage cells scannable by adding slave latch circuitry that, when switched to the scan test mode, is activated, along with a connection from the storage cell latch that converts that latch into a master latch feeding the specially activated slave latch to achieve, as known in the art, a master-slave flip-flop.

Figure 1:
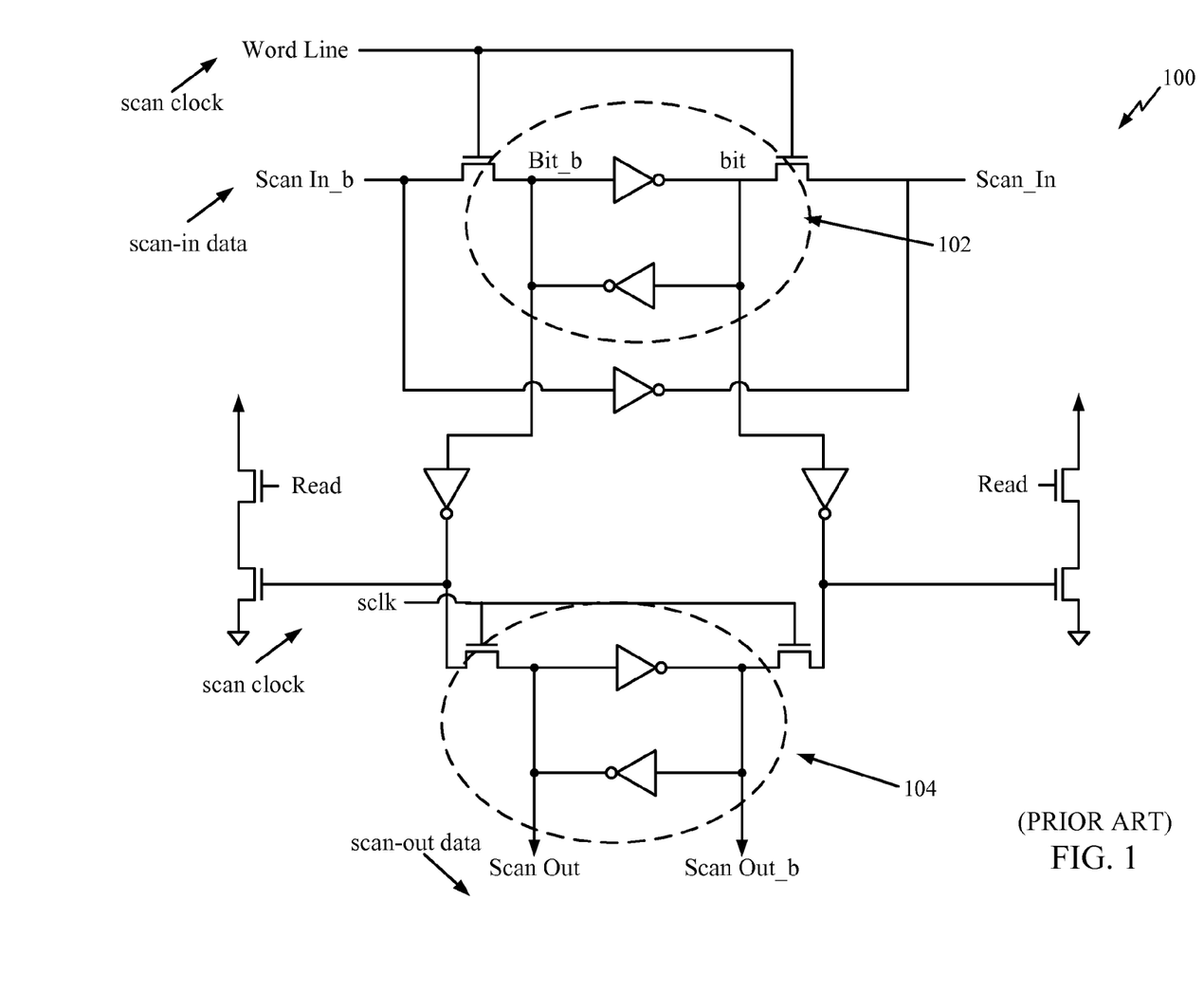
FIG. 1 shows a prior art storage cell providing a normal latch operation and a test mode scannable flip-flop operations.

Prior art FIG. 1 shows an example of a scannable storage cell 100 having an example of the above-described circuitry for enabling the cell to operate in a master-slave flip-flop mode, exemplifying the known means for making scannable storage cells. Referring now to prior art FIG. 1, the example 100 comprises a level sensitive data latch 102 and a shadow slave latch 104. The slave latch 104 is commonly termed a "shadow" latch because it performs no function in the normal mode operations of reading and writing to the cell. Details of the construction and operation of the prior art FIG. 1 example 100 are well-known to persons of ordinary skill in the art and, therefore, a thorough discussion is omitted. In brief overview, in the normal mode of operation, the word line acts as the clock for triggering read/write operations on the level sensitive data latch 102. In a scan mode, during a first clock cycle, scan-in data is written into the now master level sensitive latch 102. A separate scan clock is used to capture scan-in data from the master into the slave latch 104. At the rising edge of the next clock cycle, the scan-in data is output as scan-out data which is fed into a neighboring latch (not shown in FIG. 1) that is also similarly converted into a scannable flip-flop.

As can be understood from FIG. 1, and as known in the pertinent art, the slave latch 104 has substantially the same component circuitry as the level sensitive data latch 102. Therefore, the area required for the slave latch 104 is approximately the same as the area required for the level sensitive data latch 102. The result of this complexity of conventional methods for making storage cells such as, for example, the storage cells of a register file, scannable nearly doubles the area of the register file. For large register files and other large arrays of storage cells, this is a substantial cost. Moreover, as the slave latch 104 is typically fabricated in the same technology and in the same processing steps as the level sensitive data latch 102 (or master latch in the scan mode), the slave latch 104 may itself be a source for faults.

SUMMARY

Exemplary embodiments include scannable storage cells and registers, and systems and methods for scan test of storage cells and registers according to various embodiments.

One example of scannable registers according to one or more of the various embodiments includes a plurality of storage cells, each storage cell having a scan input and a scan output, a latch coupled to the scan input, the latch having a latch output, and a switch gate, coupled to the latch output, having a switch control input to receive a scan clock and, in response to the scan clock, to switchably couple the latch output to the scan output and to uncouple the latch output from the scan output, wherein the scan output of each of the storage cells is coupled to the scan input of a corresponding next one of the storage cells.

According to one aspect, an example scannable register according to one or more of the various exemplary embodiments includes switch gates configured such that in response to the scan clock switching the switch gate of a first of the storage cells to couple its latch output to the input of its corresponding next one of the storage cells, substantially concurrent with an uncoupling of a given value from the latch input of the first scannable storage cell, the latch of the first storage cell latches to the given value, and the latch of the corresponding next one of the storage cells latch switches to the given value.

One example of a scannable storage apparatus according to one or more of the various embodiments includes a first storage cell and a second storage cell, each having a scan input and a scan output, and each including a latch coupled to the scan input, the latch coupled to a latch output switch gate having a switch control input to receive a scan clock and, in response to the scan clock, to switchably couple the latch to the scan output, wherein the scan output of the first storage cell is coupled to the scan input of the second storage cell.

According to one aspect, an example scannable storage apparatus according to one or more of the various exemplary embodiments includes the latch output switch gate of the first storage cell and the latch output switch gate of the second storage cell configured and arranged to cyclically switch between a coupled state and an uncoupled state in response to a cyclical scan clock, the cyclical switching including the latch output switch gate of the first storage cell switching to the coupled state substantially concurrent with the latch output switch gate of the second storage cell switching to the uncoupled state, followed by the latch output switch gate of the second storage cell switching to the coupled state substantially concurrent with the latch output switch gate of the first storage cell switching to the uncoupled state.

According to one aspect, an example scannable storage apparatus according to one or more of the various exemplary embodiments includes the latch selectively coupled to an external read line, to selectively read the latch state of at least one of the first and second storage cells.

One example of methods according to one or more of the various exemplary embodiments includes providing approximately N/2 odd storage cells and approximately N/2 even storage cells, each of the storage cells having a latch having an input and an output and having a switch gate, the switch gate of each odd storage cell selectively coupling the cell's latch output to the input of the latch of a corresponding next even storage cell, and the switch gate of each even storage cell selectively coupling the cell's latch output to the input of the latch of a corresponding next odd storage cell, and further includes: a) controlling the switch gates of the storage cells to couple the latch output of each of the even storage cells to the latch input of its corresponding next odd storage cell substantially concurrent with uncoupling the latch output of each of the odd storage cells from the input of its corresponding next even storage cell, followed by b) controlling the switch gates to couple the latch output of each of the odd storage cells to the latch input of its corresponding next even storage cell substantially concurrent with uncoupling the latch output of each of the even e storage cell from the input of its corresponding next odd storage cell.

One example of methods according to one aspect of one or more of the various exemplary embodiments further includes sequentially shifting a latch state from a first of the storage cells though approximately M pairs of the storage cells, each pair being any of an odd storage cell and its corresponding next even storage cell or an even storage cell and its corresponding next odd storage cell, by repeating a) and b) approximately M times.

One example of methods according to one or more of the various exemplary embodiments includes providing approximately N/2 odd storage cells and approximately N/2 even storage cells, each of the storage cells having a latch having an input and an output and having a switch gate, the switch gate of each odd storage cell selectively coupling the cell's latch output to the input of the latch of a corresponding next even storage cell, and the switch gate of each even storage cell selectively coupling the cell's latch output to the input of the latch of a corresponding next odd storage cell, and further includes: a) generating a scan clock having rising edges and falling edges, b) in response to one of a rising and falling edge of the scan clock cycle, switching the latch output of each of the corresponding next even storage cells to the state of the latch output of its corresponding even storage cell, substantially concurrent with latching the latch output of each of the next odd storage cells to the state of the latch output of its corresponding even storage cell, followed by c) in response to a subsequent of rising or falling edge of the scan clock cycle, switching the latch output of each of the corresponding next odd storage cells to the state of the latch output of its corresponding even storage cell, substantially concurrent with latching the latch output of each of the next even storage cells to the state of the latch output of its corresponding odd storage cell.

One example of methods according to one aspect of one or more of the various exemplary embodiments further includes sequentially shifting a latch state from a first of the storage cells though approximately M pairs of the storage cells, each pair being any of an odd storage cell and its corresponding next even storage cell or an even storage cell and its corresponding next odd storage cell, by generating M scan clock cycles and, in response to each cycle, repeating b) and c).

One example of methods according to one aspect of one or more of the various exemplary embodiments includes a reading of R of the storage cells after the sequential shifting.

One example scannable storage apparatus according to one or more of the various embodiments includes a first storage cell having a first latch having a latch input and a latch output and a second storage cell having a second latch having a latch input and a latch output, means for coupling a given scan data to the latch input of the first latch to switch the first latch to the given scan data, means for uncoupling the given scan data from the input of the first latch to latch the first readable latch to the given scan data, means for coupling the output of the first latch while latched to the given scan data to the input of the second latch to switch the second latch to the given scan data, and means for uncoupling the output of the first latch from the input of the second latch, while the second latch is latched to the given scan data, to latch the second latch to the given scan data.

One example scannable N-bit register according to one or more of the various embodiments includes N one-bit storage cells, each of the storage cells having a one-bit latch having a latch input and a latch output, arranged as approximately N/2 even storage cells and approximately N/2 odd storage cells, each even storage cell having one corresponding next odd storage cell from among the odd storage cells and each odd storage cell having one corresponding next even storage cell from among the even storage cells, means for generating a scan clock having repeating cycles, each cycle having a first clock event followed by a second clock event, first shift means for receiving the scan clock and, in response to the first clock event of a scan clock cycle, coupling the latch output of each of the odd storage cells to the latch input of its corresponding next even storage cell to switch the state of that latch to the state of the latch of the odd storage cell and, substantially concurrent with that coupling, uncoupling the latch output of each of the even storage cells from the latch input of its corresponding next odd storage cell to latch the state of the latch of that odd storage cell at the state of that latch prior to the uncoupling, and second shift means for receiving the scan clock and, in response to the second clock event of the scan clock cycle, uncoupling the latch output of each of the even storage cells from the latch input of its corresponding next odd storage cell to latch the state of that latch at its state prior to the uncoupling and, substantially concurrent with that uncoupling, coupling the latch output of each of the odd storage cells to the latch input of its corresponding next even storage cell to switch the state of that latch to the state of the latch of the odd storage cell.

According to one aspect, an example scannable N-bit scannable register according to one or more of the various exemplary embodiments includes first shift means and second shift means wherein, in response to receiving approximately M of the cycles of the scan clock, the first and second shift means perform their respective coupling and uncoupling approximately M times to sequentially shift a latch state from a first of the storage cells though approximately M pairs of the storage cells, each pair being any of an odd storage cell and its corresponding next even storage cell or an even storage cell and its corresponding next odd storage cell.

The above-summarized illustrative examples, aspects and features of the various exemplary embodiments are not intended to be exhaustive or limiting, and other aspects, features, advantages, variations and applications of the various exemplary embodiments will be apparent to persons of ordinary skill in the art will upon reading this disclosure in its entirety.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing illustrative examples of particular embodiments and is not intended to be limiting of embodiments of the invention.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Further, those of skill in the art will appreciate that information and signals encoding the information may be represented using any of a variety of different technologies and techniques. Information and bits of such information, as well as symbols encoding same, embodying such as, for example, input data, operand data, parameter data, instructions, and commands, that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps may be described, generally, in whole or in part, in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as effecting a departure from the scope of the present invention.

The methods, sequences and/or algorithms described in connection with the disclosed embodiments may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of computer readable storage medium known in the arts pertaining to this disclosure. An exemplary storage medium is coupled to the processor such that the processor can read information from, and write information to, the storage medium. In the alternative, the storage medium may be integral to the processor.

Accordingly, the invention is not limited to illustrated examples and any means for performing the functionality described herein are included in embodiments of the invention.

It will be understood that the term "register" is defined in this disclosure to mean any arrangement of read-write storage cells, of any technology, single-bit or multi-bit, capable of storing a related string of bits data and encompassing, without limitation, any one or more from among illustrative examples such as addressable register, content-addressable register, stack register and push-pop register, standing alone or within a single port or multi-register file. In the description of various exemplary embodiments, references to example operations on specific types of registers does not, unless otherwise stated or made otherwise clear from the context, limit the described operation or aspect to embodiments practiced on that specific register type. Storage cells that form a register within this meaning may be, but are not necessarily, arranged in an array manner.

Figure 2:
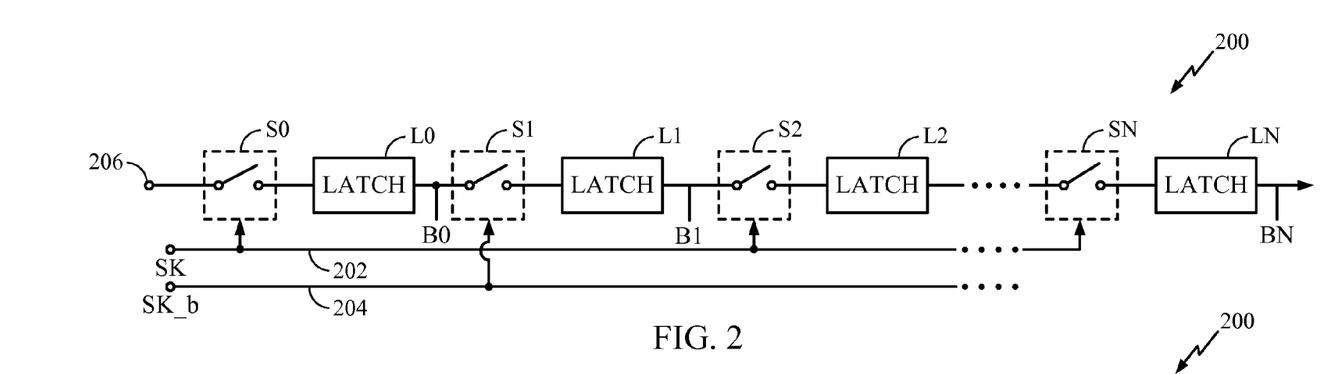
FIG. 2 shows a block schematic of one example scannable register file according to one or more of the various exemplary embodiments, depicted in an example operational state.

FIG. 2 depicts one example model of one scannable register 200 according to one or more exemplary embodiments. The example 200 includes a plurality of latch cells, labeled in left-to-right order as L0, L1, L2 ... LN, each arranged with a corresponding switch gate, labeled, in left-to-right order, as S0, S1, S2 ... SN. All of the even-numbered gates, i.e., gates S0, S2 ... SN (assuming N is an even number) are controlled by a scan clock SK via a scan clock line 202, and all of the odd-numbered switch gates are controlled by a second scan clock, SK_b, which may be, but is not necessarily, the inverse of clock SK, via a second scan clock line, 204.

In reference to the FIG. 2 example 200 and its later described details of operation, it may be preferable that the rising edge of SK be substantially co-incident with the falling edge of SK_b and, likewise, that the falling edge of SK be substantially co-incident with the rising edge of SK_b. As will be understood by persons of ordinary skill in the art upon viewing this disclosure, depending on the particular internal circuitry chosen to implement latches such as L0 ... LN, differences between these respective rising and falling edges may result in various circuit components sourcing or sinking high current.

With continuing reference to FIG. 2, the input of switch gate S0 is shown coupled to scan test input terminal 206. According to one aspect, scan test input terminal 206 receives, during a scan test operation that is later described in greater detail, a SCAN_IN bit sequence. It will be understood that the term "scan input terminal" is only a reference point for purposes of describing the FIG. 2 example in the context of a scan test environment, and simply means a given point preceding latch L0 on whatever scan shift chain or other path carries the SCAN_IN bit sequence to latch L0, and implies no limitation on the physical structure or placement of that point.

Regarding the particular bit values of the SCAN_IN bit sequence, as well as the structure and method for generating the SCAN_IN bit sequence, it will be understood that these are not necessarily specific to the embodiments, and may, for example, be any bit sequence and may be generated by any means for scan bit sequence generation that are known in the art.

FIG. 2 depicts the example scannable register 200 in its normal register operation state, as opposed to its scan test states that are later described. In the normal register operation state, latches L0 ... LN receive, store, and output data independent of one another under control of, for example, read lines, word lines and bit lines that are not depicted in FIG. 2, and that may be in accordance with the known art.

With continuing reference to FIG. 2, in the normal register operation state all of the switch gates S0 ... SN are open or in an equivalent state that sufficiently isolates the output of each latch L1 ... LN from the input of its succeeding latch. The FIG. 2 depicted open state may be achieved by, for example, switching OFF the scan clocks SK and SK_b.

Figure 3A:
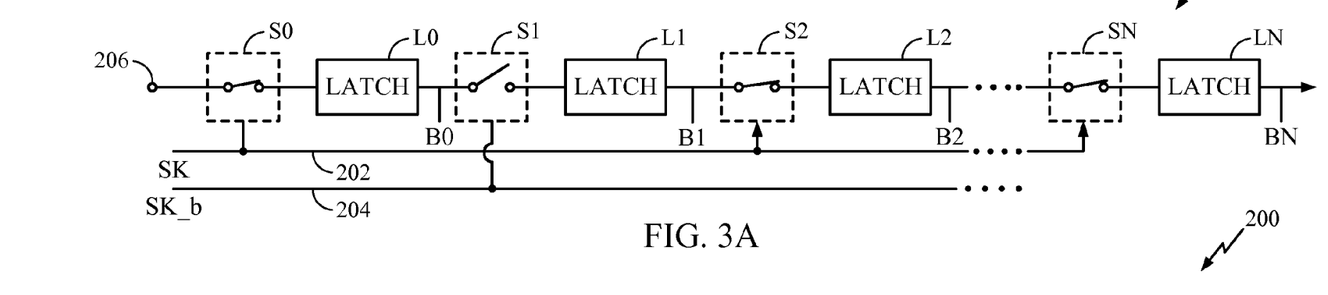
FIG. 3A shows the block schematic of the FIG. 2 scannable register file, depicted in a first scan shift state.
Figure 3B:
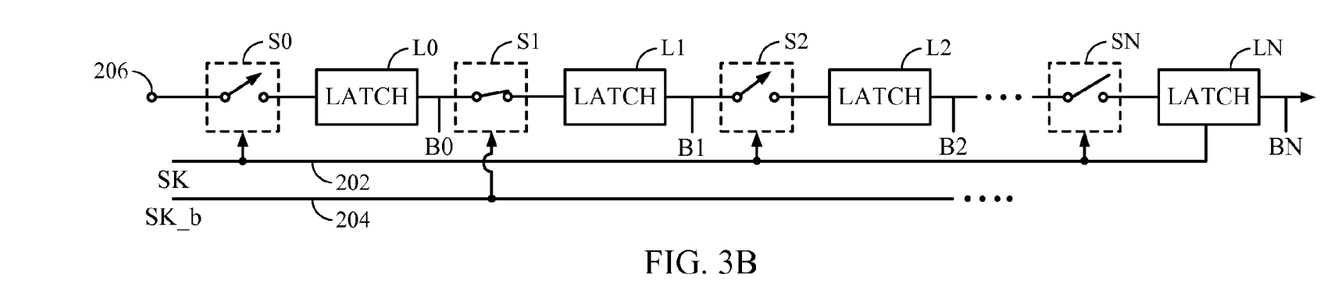
FIG. 3B shows the block schematic of the FIG. 2 scannable register file, depicted in a second scan shift state.

Referring to FIGS. 3A and 3B these depict, respectively, the state of the FIG. 2 example resulting from a succession in time of an SK clock rising edge, which switches the example scannable register 200 to the state depicted at FIG. 3A, followed by a clock SK_b rising edge, which switches the example scannable register 200 to the state depicted at FIG. 3B. An illustrative example scan shift operation, snapshots of which are represented by the FIGS. 3A and 3B states, which will also be referenced for this description as "scan shift first state" or "first state," and "scan shift second state" or "second state," will be described in further reference to an illustrative scan shift timing diagram shown at FIG. 4. It will be understood that choice of the terms "first" and "second" in relation to the scan shift states is arbitrary.

With reference to the scan shift first state shown at FIG. 3A, in the example scannable register 200 the depicted state results from the rising edge of clock SK switching all of the switch gates preceding the input of an even-numbered latch switch to a closed or coupled position, and the falling edge of clock SK_b switching all of the switch gates connecting the output of an even numbered gate switch to an open or uncoupled position. Since each of the even-numbered latch inputs, as a result, becomes coupled to the output of its preceding odd numbered latch, and since each of these even-numbered latches has its output open, each of these outputs (except for the first latch L0) switches to the value on that output of its preceding odd-numbered latch. The output of the first latch L0 switched to the SCAN_IN value that was on its input.

Referring now to FIG. 3B, this depicted second shift state results from the rising edge of SK_b and the (preferably, but necessarily, substantially concurrent) falling edge of SK. More particularly, the rising edge of SK_b switches all of the switch gates preceding the input of an odd-numbered latch switch to a closed or coupled position, and the falling edge of SK switches all of the switch gates at the output of an odd-numbered gate switch to an open or uncoupled position. The input of each of the odd-numbered latches, as a result, becomes coupled to the output of its preceding even-numbered latch, and since each of these odd-numbered latches has its output open, each of these outputs switches to the value on that output of its preceding even-numbered latch.

Figure 4:
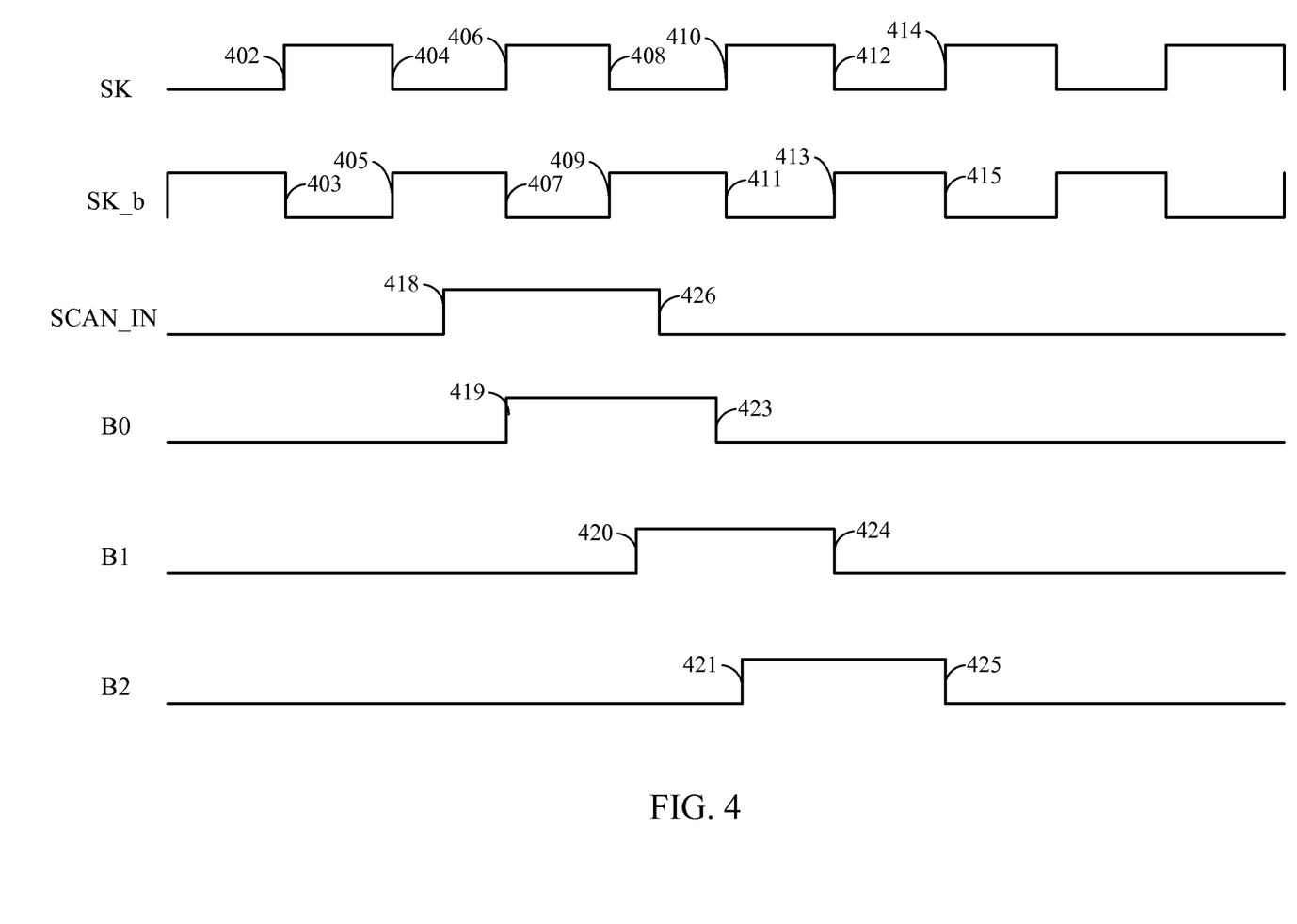
FIG. 4 depicts one illustrative timing diagram of one example clocking scheme according to one clocking aspect, in relation to the FIG. 2 example scannable register file, and a corresponding switching between a first scan shift state and a second scan shift state, and a corresponding example scan shift sequence.

FIG. 4 depicts one illustrative timing diagram of one example clocking scheme according to one clocking aspect, in relation to the FIG. 2 example scannable register 200, and a corresponding switching between the first scan shift state depicted at FIG. 3A and the second scan shift state depicted at FIG. 3B, and a corresponding illustrative example scan shift sequence. It will be understood in the descriptions referencing FIG. 4 and its relation to example operations depicted at FIGS. 3A and 3B, that waveforms depicted at FIG. 4 are two-state, consisting of a high and a low vertical position, and these may have a mapping in terms of physical state to any voltage at any polarity. Further, for purposes of describing illustrative examples, high value of the SK and SK_b clocks will be referenced as ON, the coupled state of the switching gates S0 . . . SN will be references as ON, the uncoupled state of the switching gates S0 . . . SN shown in FIGS. 2, 3A and 3B as OFF, a low value of SCAN_IN, B1 . . . BN as 0, meaning logical 0, high value of SCAN_IN, B1 . . . BN as logical 1, meaning logical 1, and low and high value of the WL and RL line will be reference as OFF and ON, respectively.

Referring now to the timing diagram of FIG. 4, together with FIGS. 2 and 3A, the depicted starting state, which is the state prior to receiving the rising edge 402 of SK, is all of B0, B1, B2 . . . BN being logical 0. At the rising edge 402 of SK each of the switch gates feeding even number latches switches to an ON state, i.e., referring to FIG. 3A, switch gates S0, S2 . . . SN switch ON, and the falling edge 403 of SK_b switches OFF (or maintains OFF, depending on their state prior to the rising edge 402 of SK) each of the switch gates feeding odd number latches switch OFF. The SCAN_IN value is thus coupled to the output of latch L0; the output of latch L1 is thus coupled to the output of latch L2, and so on, with the output of latch LN−1 being coupled to the output of latch LN. However, since SCAN_IN is 0 at the rising edge 402 of clock SK, B0 remains at 0, and since all of the outputs of the odd-numbered latches now feeding a successive even-number latch are at their initial 0 state, none of the other even-numbered latches changes.

Referring now to FIG. 4, together with FIG. 3B, next, at the rising edge 405 of clock SK_b each of the switch gates feeding an odd number latch, i.e., switch gate S1, are switched ON, and the falling edge 404 of clock SK switches OFF each of the switch gates feeding an even number latch, i.e., switch gates S0, S2 . . . SN. The output of latch L0 is thus coupled to the output of latch L1, and so on. However, since the output of latch L0 is 0, the output of latch L1 remains at its 0 initial state and, likewise since the all of the outputs of the even-numbered latches are still at 0, of the other odd-numbered latches changes.

At the rising edge 418, however, Scan_IN switches from a 0 to 1. At the next rising edge 406 of clock SK and falling edge 407 of clock SK_b, the example scannable register 200 is switched back to the first scan shift state shown at FIG. 3A. The SCAN_IN value of 1 is now coupled to the output of latch L0, changing, at time 419, B0 from a 0 to 1. The delay between the rising edge 406 of clock SK and transition 419 is not specifically shown at FIG. 4, but as readily understood by a person of ordinary skill in the art, is dependent on the particular implementation of the latches and switch gates. As shown at FIG. 4, the rising edge 406 of clock SK and falling edge 407 of clock SK_b do not change the output state any of the other even-numbered latches, because at these time instants the output of each odd-numbered latch feeding the even-numbered latches is still 0.

With continuing reference to FIG. 4, together with FIG. 3B, at the rising edge 409 of clock SK_b and falling edge 408 of clock SK, the example scannable register 200 switches again to the second scan shift state shown at FIG. 3B. In other words, each of the switch gates feeding odd numbered number latches switches ON, substantially concurrent with the falling edge 408 of clock SK switching OFF each of the switch gates feeding even number latches (i.e., switch gates S0, S2 . . . SN). The SCAN_IN value of 1 is uncoupled from latch L0 but, because of the latching function of latch L0 its output remains at 1, and that output is now coupled through switch gate S1, and through the level-sensitive latch L1 to the output of latch L1. As a result, at time 420 B1 changes from 0 to 1. As previously described with respect to the delay in B0 with respect to 406, delay between edge 409 and transition 420 is not specifically shown at FIG. 4. Similarly, the rising edge 409 of SK_b, although resulting in B1 at the output of latch L1 to change to 1, does not change the 0 state of B2, because switch gate S2 is OFF.

Referring still to FIG. 4, at time 426 SCAN_IN is depicted as changing back to 0. The time 426 in relation to the rising edge 418 at which SCAN_IN previously switched to a 1, in this example relating to the FIG. 2 example scannable register 200, be any time prior to the next rising edge 410 of the SK clock. If, on the other hand, SCAN_IN was chosen to feed two consecutive is to the example scannable register 200 SCAN_IN would remain at a 1 value until at least the rising edge 410.

Next, at rising edge 410 of the SK clock, and its substantially concurrent falling edge 411 of SK_b, the example scannable register 200 switches back to first scan shift state shown at FIG. 3A. The SCAN_IN value of 0 is now coupled through switch gate S0 and through the level sensitive latch L0 to the output of that latch L0. B0, as a result, at time 423 changes from 1 to 0. The now 0 state of B0 does not change the 1 value of B1, because switch gate S1 is OFF.

Next, at rising edge 413 of the SK_b clock, and the substantially concurrent falling edge 412 of SK, the example scannable register 200 switches again to the second scan shift state shown at FIG. 3B. B0 remains at 0 because, although coupled through switch gate S0 and latch L0 to SCAN_IN, the SCAN_IN value is still at 0. The B0 value of 0, however, is now coupled through the ON switch gate S1, and through level sensitive latch L1, to the L1 output. B1 therefore, at time 424, changes from 1 to 0. The new B1 state of 0 does not change the 1 value of B2, because switch gate S2 is OFF.

Continuing with FIG. 4, at rising edge 414 of the SK clock, and the substantially concurrent falling edge 415 of SK_b, the example scannable register 200 switches again to the first scan shift state shown at FIG. 3A. B0 remains at 0 because, although coupled through switch gate S0 and latch L0 to SCAN_IN, the SCAN_IN value is still at 0. B1 remains at zero because of the latch function of L1 when switch gate S1 is open. The B1 value of 0 is now coupled through the ON switch gate S2, and through level sensitive latch L2, to the L2 output. B2 has a rising edge 421 and, at time 425, changes from 1 to 0.

Assuming N of the latches L0 as depicted at FIG. 2, it will be readily understood that N repetitions of the above-described alternating switching of the even and odd switch gates, i.e., N cycles of substantially concurrent-edged scan clock SK and complementary clock SK_b, will perform a scan shift of the example SCAN_IN bit value of 1 through all N of the latches L0 . . . LN latches. It will also be readily understood that in the absence of the scan clocks the latches operate as regular register storage cells. Further, it will be appreciated by persons of ordinary skill in the art, viewing this disclosure, that the scan shifting is provided without slave flip-flops, such as the shadow flip flop 104 of the FIG. 1 example prior art scannable storage cell 100. Instead, the scan shifting is provided by the unique addition of only a switch gate to each of the storage cells, combined with scan clock schemes according to the embodiments.

It will be understood that in the above description the relative timing and polarity of the scan clocks SK and SK_b corresponds to the particular example switch characteristic for described for the illustrative switch gates, S0 . . . SN, namely each closing in response to its scan clock (SK or SK_b) being ON and opening in response to its scan clock being OFF. However, as will be understood by a person of ordinary skill in the art upon reading this disclosure, this is only one example combination of scan clocks and switching characteristics of switching gates such as S0 . . . SN that may be employed to obtain the described opening and closing of the even switch gates in relation to the odd switch gates and, hence, the scan shift features of the present embodiments. One illustrative example alternative embodiment implements the even numbered switch gates S0, S2 . . . SN with specific switch gates having a control polarity opposite the odd numbered switch gates, i.e., 51, and connects a common scan clock to all of the switch gates.

It will be understood that the switch gates S0 . . . SN may be formed by various means such as, for example, a single-transistor pass gate. In some applications, as will be understood by persons of ordinary skill in the pertinent art, the general issues of voltage drop relative to transistor thresholds, which are typically associated with transistor pass gates, may render such implementation not satisfactory. According to another aspect the switch gates S0 . . . SN may be complementary metal oxide transistor (CMOS) transmission gates, or equivalents, or may be formed from mixtures of single transistor pass gates and CMOS transmission gates. These are only illustrative examples, as other circuits and techniques for forming the switch gates S0 . . . SN may be apparent to persons of ordinary skill in the art upon viewing this disclosure.

Figure 5:
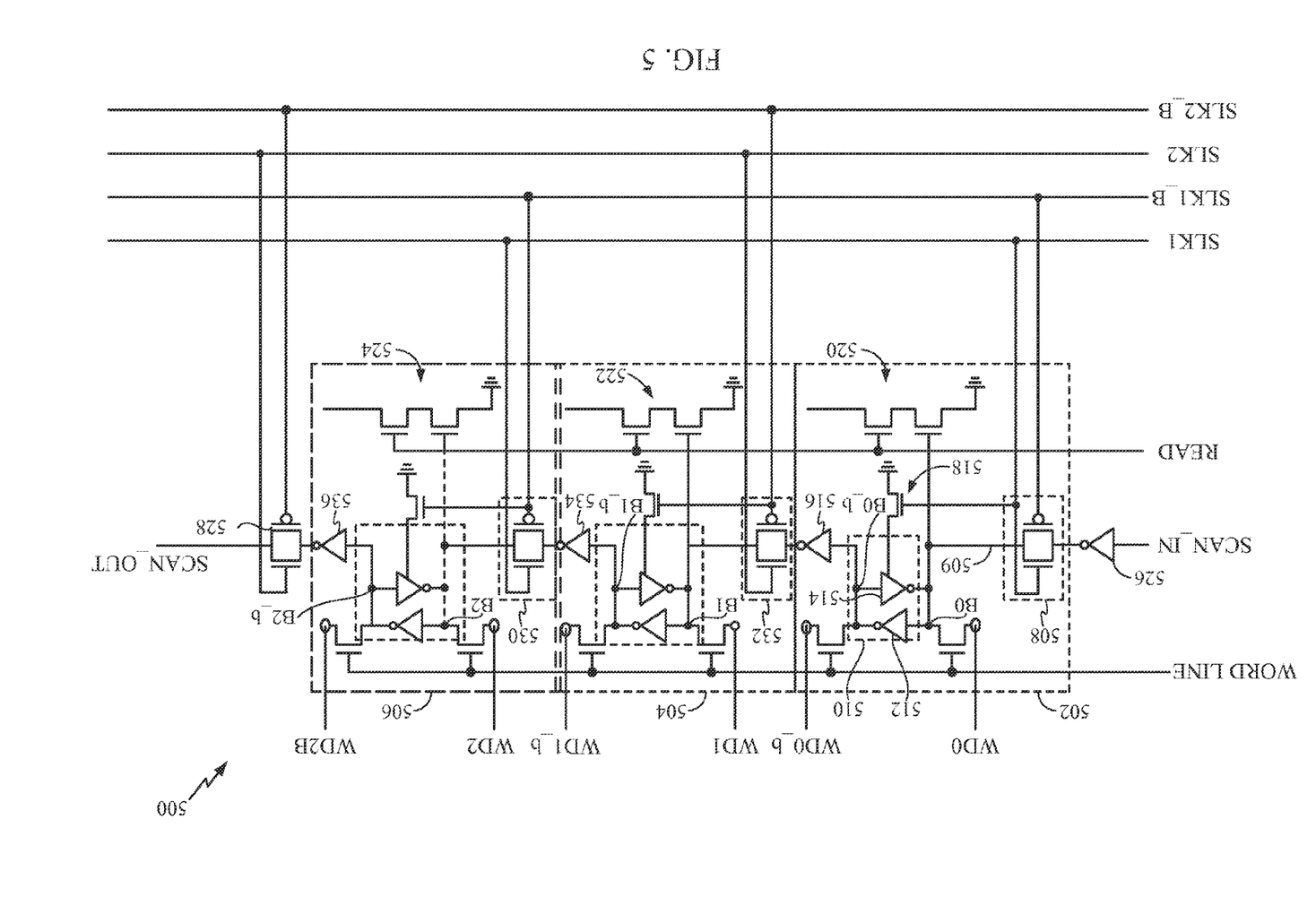
FIG. 5 shows another illustrative example scannable shift register according to one or more embodiments.

FIG. 5 shows a three-cell segment of an illustrative example of another scannable register 500 according to various aspects of one or more of the exemplary embodiments. The example scannable register 500 is constructed by three identically-structured scannable storage cells, 502, 504 and 506 and, referring to the left-most scannable storage cell as an example, each having a local duplicate of that scannable storage cell 502 input switch gate 508 coupled via transmission path 509 to level-sensitive latch 510. Level-sensitive latch 510 is constructed of a forward inverter 512 arranged parallel with a feedback inverter 514. The rightmost junction of the inverters 512, 514, i.e., the coupled junction of the output of the forward inverter 512 and the input of feedback inverter 514 holds the B0_b value of the scan state of B0, B1, B2 that is represented by the respective states of scannable storage cells 502, 504, 506 when operating in the scan shift mode, as described in greater detail in reference to FIG. 6. Example aspects and operations of the FIG. 5 example 500 refer to the scan state of B0, B1, B2 by the state of their complements, B0_b, B1_b, and B2_b, because of the output inverters 516, 534, 536 used in the example.

With continuing reference to FIG. 5, a feedback inverter enabling switch 518, depicted in the example 500 as implemented by an NFET, selectively enables and disables the feedback inverter 514 when the example 500 operates in the scan shift mode. The feedback inverter enabling switch 518 is depicted in the FIG. 5 example 500 as outside of the latch 510, but this is only one example depiction. It may, in the alternative, be considered as part of the latch 510. An inverting driver or inverter 516 propagates the inverse of B0 to the input of the switch gate 530 of the next storage cell 504. Persons of ordinary skill in the art, based on this disclosure, will understand that the respective construction of the inverter 516 and the inverters 512, 514 of the latch 510 may, or may not differ, depending on their respective application-specific drive requirements.

Referring still to FIG. 5, word transistors (not separately numbered) having their respective gates connected to the WORD line are for normal storage latch operation of each of the scannable storage cells 502, 504, 506.

With continuing reference to FIG. 5, in the scan shift mode effected by clocks SLK1 and SLK2, inverter 526 feeds an inverse of SCAN_IN to the input of the switch gate 508 of the first storage cell. The inverter 526 may be a component of another scannable storage cell (not show at FIG. 5) preceding storage cell 502. If there is no scannable storage cell preceding scannable storage cell 502 the inverter 526 may be implemented by any of the various means that will be apparent to persons of ordinary skill in the art in view of this disclosure. A switch gate 528 is depicted as driven by the output inverter (not separately numbered) of scannable storage cell 506, and this is intended to depict the switch gate of another scannable storage cell (not shown at FIG. 5) succeeding scannable storage cell 506. If scannable storage cell 506 is the last storage cell of the scan chain formed when the FIG. 5 example operates in scan shift mode then the switch gate 528 may be omitted.

The FIG. 5 example scannable register 500 is shown driven by one illustrative scan clock arrangement having one pair of complementary clocks, SLK1 and SLK1_b, controlling the switch gates of the even-numbered scannable storage cells, namely switch gate 508 of scannable storage cell 502 and switch gate 530 of scannable storage cell 506, and another pair of complementary clocks, SLK2 and SLK2_b, controlling the switch gates of the odd-numbered scannable storage cells, namely switch gate 532 of scannable storage cell 504 and switch gate 528 of the scannable storage cell (not shown at FIG. 5) succeeding scannable storage cell 506.

It will be understood that in the normal operation mode of the FIG. 5 example scannable register 500 all of the scan clocks SLK1, SLK1_b, SLK2, SLK2_b are OFF. This switches OFF all of the switch gates 508, 528, 530, 532, effectively isolating each of the B0 . . . B2 nodes from one anther.

Further, it will be understood that the complementary pair arrangement of the scan clocks SLK1, SLK1_b and of SLK2, SLK2_b, and their distribution by clock lines, corresponds to the illustrated CMOS transmission gate implementation of the switch gates 508, 528, 530 and 532, and that an alternative implementation of these switch gates, such as a simple pass transistor construction (not shown at FIG. 5) may not require the complementary clocks. Further, it will be understood that for the example scannable register of FIG. 5 it may be preferable that the rising edges of the clocks SLK1 and SLK2_b are in, or approximately in, mutual alignment with one another, and with falling edges of clocks SKL1_b and SLK2, and, likewise, that the rising edges of clocks SLK2 and SLK1_b are in, or approximately in, mutual alignment with one another, and with falling edges of clocks SKL1 and SLK2_b. The range of "approximately" is readily determined by persons of ordinary skill by applying the conventional knowledge of, for example, current spikes and time delays in integrated circuits, that such persons possess to specific implementations of the embodiments of this disclosure. Similarly, certain specific variations from strict alignment of such clock edges may be employed, as will be apparent to persons of ordinary skill in the art in view of this disclosure.

One example scan shift process performed on the FIG. 5 example scannable register will now be described, in reference to FIG. 5 and to the illustrative timing diagram shown at FIG. 6. For brevity and better focus on unique aspects and operations of the embodiment, edges of SLK1 and SLK2 are labeled, while the concurrent or approximately concurrent edges of their respective complementary scan clocks SLK1_b and SLK2_b are not individually labeled.

Figure 6:
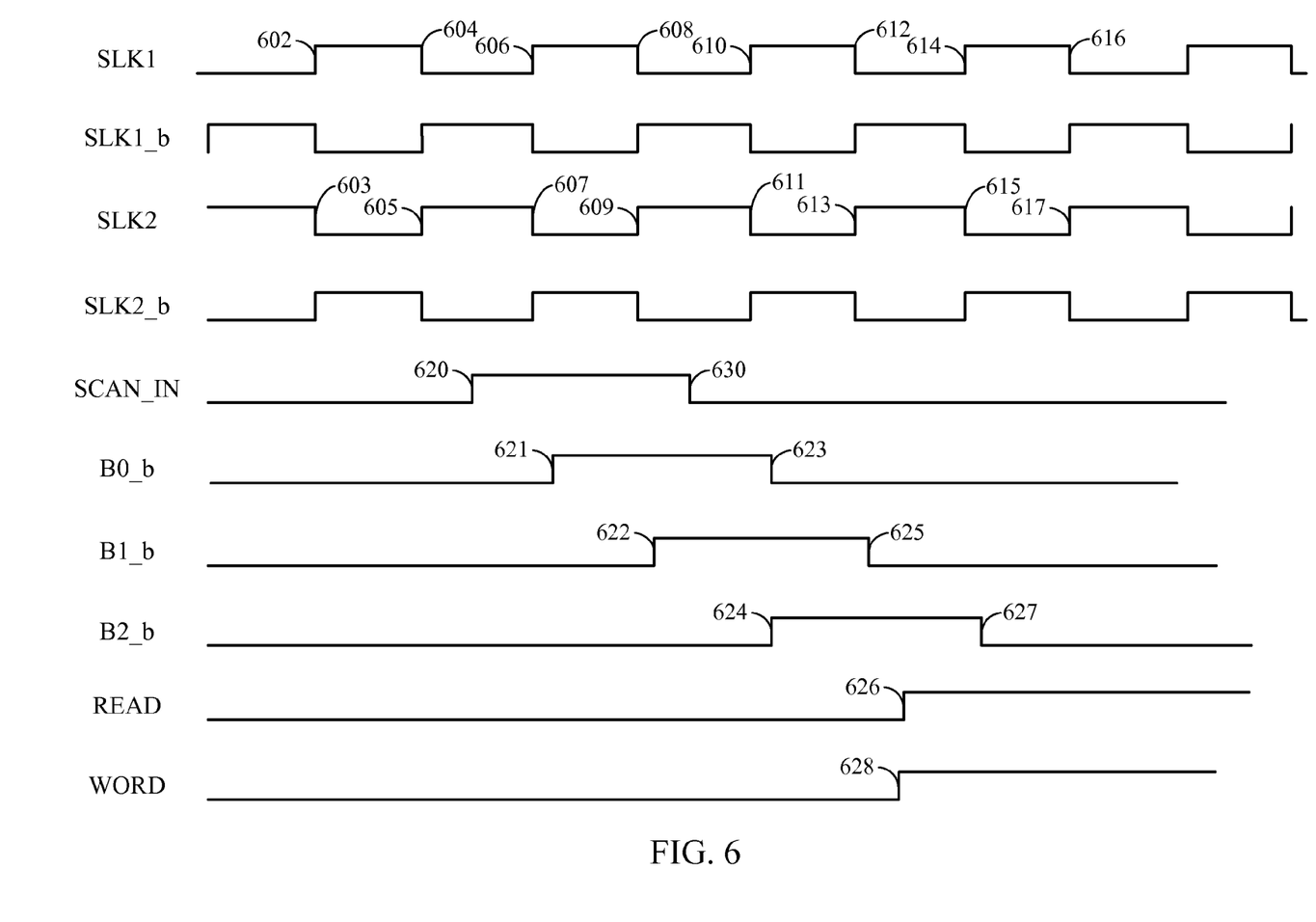
FIG. 6 depicts one illustrative timing diagram of one example clocking scheme according to one clocking aspect, in relation to the FIG. 5 example scannable register file, and a corresponding example scan shift sequence.

Referring to FIG. 6, prior to rising edge 602 of scan clock SLK1, all of the latches 512, 534, 536 are in a state such that all of B0_b, B1_b, B2_b are 0. At the rising edge 602 of SLK1 and substantially concurrent falling edge of SLK2_b, switch gates 508 and 530 are switched ON, while at the substantially concurrent falling edge 603 of SLK2 and rising edge of its complementary SLK2_b switch the switch gates 532, 528 OFF. This effects no change in B0_b, B1_b, B2_b from their initial state of 0 because SCAN_IN, though coupled to the B0 node of latch 510 in the first scannable cell 502, is 0, and node B1_b, though coupled through output inverter 534 of scannable cell 504, and through switch gate 530 to the B2_b node, is 0. Next, rising edge 605 of SLK2 and substantially concurrent falling edge 604 of SLK1, together with the falling and rising edges of their complements, respectively, switches the switch gates 508, 530 OFF and switch gates 532, 528 ON. This uncouples node B0_b from SCAN_IN, thereby latching latch 510 to hold B0_b at 0, and uncouples node B1_b from the output inverter 534 of the scannable cell 504, latching B2_b at 0. B1_b, now coupled to the output of scannable cell 502 remains at the 0 value of B0_b.

With continuing reference to FIG. 6, next, at 620, after the above-described switching, but before the next edge of any of the scan clocks, SCAN_IN changes to a 1. Next, the subsequent rising edge 606 of SLK1, and the substantially concurrent falling edge of its complement SLK1_b performs the same switching operation on the switch gates 508, 530 caused, as described above, by the same clock event at 502. The SCAN_IN signal is again coupled to the B0_b node of latch 510 but, being a 1, it causes B0_b to change to 1 at time 621. Time 621 is subsequent to rising edge 606 by a delay that is dependent on the technology implementing the scan cells 502, 504, 506. B2_0 remains unchanged for the same reason as described in reference to edge 602. Substantially concurrent with the switching operations at 606 changing B0_b to 1, the falling edge 607 of SLK2 and corresponding rising edge of SLK2_b switch the switch gates 532, 528 OFF. Assuming the falling edge 607 is such that the switching of switch gate 532 is performed prior to the B0 change at 621 propagating to node B1_b, B1_b latches at the prior B0_b value of 0. The node B2_b, driven by the B1_b node through output inverter 534 and switch gate 530, remains at 0 value.

Next, the falling edge 608 of clock SLK1 and substantially concurrent rising edge of its complement clock SLK1_b performs the same switching operation on the switch gates 508, 530, caused, as described above, by the same rising edge clock event 604. SCAN_IN, still at the 1 value is thereby uncoupled from the B0_b node of latch 510, which latches B0_b to a 1 value. B2_b latches at the prior value of B1_b, which is 0. Substantially concurrent with these switching operations at the SLK1 falling edge 608, the rising edge 609 of SLK2 and corresponding falling edge of clock SLK2_b switch the switch gates 532, 528 ON. The B0_b value of 1 therefore propagates to the B1_b node through the switch 532, switching B1_b to a 1 value at time 622. Regarding the latching of B2_b to a 0 value described above in reference to SLK1 falling edge 608, this assumes the falling edge 608 is such that the switching OFF of switch gate 530 is performed prior to the B1_b change to 1 at time 622.

Referring still to FIG. 6, next, at the falling edge 611 of clock SLK2 and substantially concurrent rising edge of its complement clock SLK2_b performs the same switching operation on the switch gates 532, 528, caused, as described above, by the same clock edge at 607, while the substantially concurrent rising edge 610 of clock SLK1 and substantially concurrent falling edge of its complement clock SLK1_b performs the same switching operation on the switch gates 508, 530, caused, as described above, by the same clock edge at 606. The switching ON of switch gate 508 couples SCAN_IN, now at 0 value, to the B0_b node, driving B0_b to 0 value at 623, and switching ON of switch gate 530 couples the B1_b node to the B2_b node, driving B2_b to a 1 value at 624.

Next, at the falling edge 612 of clock SLK1 and substantially concurrent rising edge of its complement clock SLK1_b, switch gates 508, 530 are switched OFF, and at the substantially concurrent rising edge 611 of clock SLK2 and substantially concurrent falling edge of its complement clock SLK2_b switch gates 532, 528 are switched ON. The switching ON of switch gate 532 couples node B0_b to node B1_b, driving B1_b to a 0 value at time 625. The switching OFF of switch gate 530, assuming it is performed prior to the change of B1_b to 0 value at time 625 propagating to the B2_b node, latches B2_b to its previous value of 1.

Referring still to FIG. 6, at the falling edge 612 of clock SLK1 and substantially concurrent falling edge of its complement clock SLK1_b, switch gates 508, 530 are switched ON, and at the substantially concurrent falling edge 615 of clock SLK2 and substantially concurrent rising edge of its complement clock SLK2_b switch gates 532, 528 are switched OFF. The switching ON of switch gate 508 couples the SCAN_IN value, still at 0, to node B0_b, and B0_b therefore stays at 0. The switching ON of switch gate 530 couples the B1_b node, now at 0 value, to the B2_b node, driving B2_b to 0 value at time 627. Also, please note that in FIG. 6, that 613, 614, 617, 626 and 628 refer to rising edges and 616 and 630 refer to falling edges.

The above-described scan clock sequencing performed an illustrative example scan shift of a SCAN_IN bit of 1, from left to right, through the series of three adjacent scannable storage cells 502, 504, 506. Stated differently, the described process walks the SCAN_IN date through the series of latches 512, 534, 536, and out as SCAN_OUT date. The SCAN_OUT date can be read out and compared with SCAN_IN to analyze faults in the scan chain, using, for example, analysis methods currently well known to persons of ordinary skill in the pertinent art.

Further, as illustrated, using the read transistor pairs 520, 522, 524 a port (not shown in FIG. 5) coupled to the scannable storage cells 502, 504, 506, the data written into each of the storage cells 502, 504, 506 cell can be read out in a similar manner as described above, in order to test the read ports. As can be seen, this technique significantly lowers complexity, when compared to prior art techniques wherein separate metal wires are added to test each port of a multi-port register file. Further, as will be appreciated by persons or ordinary skill in the art in view of this disclosure, embodiments provide, among other features and benefits, ability to quickly scan/test the memory registers without to having to identify and weed out dies with defective memory registers. As readily understood by such persons, this avoids the time and expense and, essentially, the penalty of having to conduct a full test time, which can be particularly expensive if ports and port interactions are to be tested exhaustively. Further, as will be appreciated by persons or ordinary skill in the art in view of this disclosure, embodiments provide, among other features and benefits for separating or isolating issues associated with the memory registers from port-related issues such as, for example, dynamic noise coupling, and switching noise.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Among other features, benefits and advantages provided by methods and devices according to the various exemplary embodiments is the removal of the prior art need for adding fake slave latches. This, in turn, provides numerous secondary benefits and advantages, including an approximate halving of the chip area cost of making storage cells scannable, and a significant reduction in false scan test readings due to faulty slave latches. As will be further appreciated by persons of ordinary skill in the art upon reading this disclosure, methods and devices according to the described embodiments require the scan data to pass through only half the number of latches, as compared to prior art techniques, as the fake slave latches are removed from the chain. This in turn provides, among other benefits and advantages, scan testing at approximately double the speed at which scan testing can be performed with prior art methods, devices and techniques—at least with respect to the time required for shifting the scan sequence through the scan chain.

Further, will be appreciated by persons of ordinary skill in the art upon reading this disclosure, simplicity of design attainable through practice according to the various exemplary embodiments eliminates the need for introducing complex metal wires for proving testability of multiple read and write ports, as the register file can be efficiently tested by simply walking the scan data through every latch in the register file.

Another of the various features, benefits and advantages provides by the described embodiments is that scan testing may be performed at low frequencies, and therefore switch or transmission gates such as, for example, switch gates 508, 528, 530, 532 of the FIG. 5 example scannable register 500, may be sized down to provide just enough drive strength to support the low frequency of operation, thus further saving on area. Still further provided by this feature and benefit is that by sizing down the switch gates and performing lower frequency scan testing, devices under test can be saved from failures that may be introduced by high power signals that are characteristic of high frequency testing and large drive strengths.

As previously described in this disclosure, description of specific examples according to the various embodiments in reference to register files is only for purposes of describing one illustrative example of various applications that will be apparent to, and appreciated by persons of ordinary skill in the art upon reading this disclosure, and upon practicing according to described embodiments. For example, the disclosed embodiments may be practiced by, and embodied within any latch based design that requires scan testing, without limitation to register files and memory arrays.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A scannable register comprising:
a plurality of storage cells, each storage cell having:
a scan input and a scan output,
a latch coupled to the scan input, the latch having a latch output,
a switch gate, coupled to the latch output, having a switch control input to receive a scan clock and, in response to the scan clock, to switchably couple the latch output to the scan output and to uncouple the latch output from the scan output,
wherein the scan output of each of the storage cells is coupled to the scan input of a corresponding next one of the storage cells, and
wherein at least one of the storage cells is configured to write to its latch while its switch gate is not receiving the scan clock.

2. The scannable register of claim 1, wherein the switch gate includes a pass transistor.

3. The scannable register of claim 1, wherein the switch gate includes a transmission gate having parallel NMOS and PMOS transistors.

4. The scannable register of claim 1, wherein the switch gate includes a transmission gate having parallel NMOS and PMOS transistors.

5. A scannable register according to claim 1, wherein at least one of the scannable storage cells is selectively coupled to a read/write line.

6. A scannable register according to claim 1, wherein the latch of each storage cell, in response to a given value coupled to the scan input of the storage cell, switches to said given value.

7. A scannable register according to claim 6, wherein the latch of each storage cell, in response to an uncoupling of a given value from the scan input of the storage cell, latches to said given value.

8. A scannable register according to claim 7 wherein, in response to the scan clock switching the switch gate of a first of the storage cells to couple its latch output to the scan input of its corresponding next one of the storage cells, substantially concurrent with an uncoupling of a given value from the latch input of the first scannable storage cell, the latch of the first storage cell latches to said given value, and the latch of the corresponding next one of the storage cells latch switches to said given value.

9. A scannable register according to claim 8, wherein in response to coupling an updated given value onto the scan input of the first of the storage cells, substantially concurrent with the scan clock switching the switch gate of the first of the storage cells OFF to uncouple its latch output from the scan input of the corresponding next one of the storage cells, the latch of the first of the storage cells switches to the updated given value and the latch of the corresponding next one of the storage cells latches at the given value on its scan input at the switching OFF of the switch gate of the first of the storage cells.

10. A scannable register according to claim 8, wherein the first of the storage cells is a first storage latch of a register file and the corresponding next one of the storage cells is a second storage latch of the register file.

11. A scannable register according to claim 10, further comprising a scan clock generator generating the scan clock to have a scan shift cycle, the scan shift cycle having a first clock event that switches the switch gate of one of the storage cells ON substantially concurrent with switching OFF the switch gate of its corresponding next one of the storage cells, followed by second clock event that switches the switch gate of said one of the storage cells OFF substantially concurrent with switching ON the switch gate of said corresponding next one of the storage cells.

12. A scannable register according to claim 11, wherein in response to a sequence of a first and a second successive scan shift cycles, with a given value being on the scan input of the one of the storage cells through the first scan shift cycle and an updated given value being on said scan input through the second scan shift cycle, at the first clock event of the first scan shift cycle the latch of the one of the storage cells switches to the given value, at the second clock event of the first switch cycle the latch of the one storage cells latches at said given value and the latch of the corresponding next one of the storage cells switches to said given value, at the first clock event of the second shift cycle the latch of the one storage cell switches to the updated given value and the latch of the corresponding next one of the storage cells latches at the given value, and at the second clock event of the second scan shift cycle the latch of the one of the storage cells latches at the updated given and the latch of the corresponding next one of the storage cells switches to the updated given value.

13. A scannable register according to claim 12, wherein the scan clock includes a first scan clock connected to the control input of the switch gate of the one storage cell and a second scan clock connected to the control input of the switch gate of the corresponding next one of the storage cells, each of the first scan clock and the second scan clock having rising and falling edges, the first clock event is one of the rising edge and the falling edge of the first scan clock and the second scan clock is one of the rising and falling edges of the second scan clock, wherein the first clock event is one of the rising and falling edges of the first clock and one of the rising and falling edges of the second clock, and the second clock event the other of the rising and falling edge of the first clock and the other of the rising and falling edge of the second clock.

14. A scannable register according to claim 13, wherein the rising and falling edges of the first scan clock are substantially concurrent with the rising and falling edges of the second scan dock, first switch gate and said control input of said second switch gate are for receiving, respectively, said first scan clock and said second scan clock, with said second scan clock falling edge transition substantially aligned in time with said first scan clock rising edge transition, and said first scan clock falling edge transition substantially aligned in time with said second scan clock falling edge transition.

15. A scannable register according to claim 11, wherein the scan clock includes a first scan clock connected to the control input of the switch gate of the one storage cell and a second scan clock connected to the control input of the switch gate of the corresponding next one of the storage cells, each of the first scan clock and the second scan clock having rising and falling edges, the first clock event is one of the rising edge and the falling edge of the first scan clock and the second scan clock is one of the rising and falling edges of the second scan clock.

16. A scannable register according to claim 1, wherein the at least one storage cell configured to write to its latch while its switch gate is not receiving the scan clock further comprises transistors configured to receive a word line and, in response to a signal on the word line, to write to said latch.

17. A scannable register according to claim 1, wherein the at least one storage cell further comprises a read circuit configured to receive a read line and, in response to a signal on the read line, to couple the latch to a read output.

18. A scannable register according to claim 1, wherein the scannable register is integrated in at least one semiconductor die.

19. A scannable register according to claim 18, further comprising a device, selected from the group consisting of a set top box, music player, video player, entertainment unit, navigation device, communication device, personal digital assistant (PDA), fixed location data unit, and a computer, into which the scannable register is integrated.

20. A method for scan test of a first latch having an input and an output and a second latch having an input and an output, comprising steps of:
switching the first latch to a state corresponding to a given scan data, wherein said switching comprises coupling the given scan data to the input of the first latch;
latching the first latch aid state, wherein said latching comprises uncoupling said given scan data from the input of the first latch;
switching the second latch to said state, wherein said switching comprises coupling the output of the first latch while latched at said state to the input of the second latch;
latching the second latch at said state, wherein said latching comprises uncoupling the output of the first latch from the input of the second latch; and
uncoupling the output of the first latch from the input of the second latch and, while the input of the second latch is uncoupled from the output of the first latch, performing a write operation on the second latch.

21. A method for scan test of a latch and a second latch according to claim 20, wherein said uncoupling said given scan data from the input of the first latch to latch the first latch at said state is performed substantially concurrent with said coupling the output of the first latch while latched at said state to the input of the second latch to switch the second latch to said state.

22. A method according to claim 21, wherein said uncoupling said given scan data from the input of the first latch is performed by switching OFF a first switch gate between a given source of the given scan data and said input, and said coupling the output of the first latch while latched at said state to the input of the second latch is performed by switching ON a switch gate between the output of the first latch and the input of the second latch, and wherein said switching OFF is performed substantially concurrent with said switching ON.

23. A method according to claim 20, wherein said coupling a given scan data to the input of the first latch to switch the first latch to said state comprises switching ON a switch gate between the input of the first latch and a given source of said given scan data.

24. A method according to claim 23, wherein said coupling the output of the first latch while latched to said state to the input of the second latch is performed by switching ON a switch gate between the output of the first latch and the input of the second latch.

25. A method according to claim 24, wherein said uncoupling the output of the second latch while switched at said state to latch the second latch at said state is performed by switching OFF the switch gate between the output of the first latch and the input of the second latch.

26. A method for scan test, comprising:
a) providing approximately N/2 odd storage cells and approximately N/2 even scannable storage cells, where N is an integer, each of the storage cells having a latch having a latch input and latch output, the latch output of each odd storage cell being selectively coupled to the latch input of a corresponding next even storage cell, and the latch output of each even storage cell being selectively coupled to the latch input of a corresponding next odd storage cell,
b) generating a scan clock having repeating cycles, each cycle having a first clock event followed by a second clock event;

c) in response to the first clock event of a scan clock cycle, coupling the latch output of each of the odd storage cells to the latch input of its corresponding next even storage cell to switch the state of the latch of its corresponding next even storage cell to the state of the latch of the odd storage cell and, substantially concurrent with said coupling, uncoupling the latch output of each of the even storage cells from the latch input of its corresponding next odd storage cell to latch the state of the latch of said odd storage cell at the state of said latch prior to said uncoupling;

d) in response to the second clock event of said scan clock cycle, uncoupling the latch output of each of the even storage cells from the latch input of its corresponding next odd storage cell to latch the state of the latch of its corresponding next odd storage cell to the state of said latch prior to said uncoupling and, substantially concurrent with said uncoupling, coupling the latch output of each of the odd storage cells to the latch input of the latch of its corresponding next even storage cell to switch the state of said latch to the state of the latch of the odd storage cell;

e) in response to an absence of said scan clock, changing said approximately N/2 odd storage cells and said a approximately N/2 even scannable storage cells to a normal latch operation; and f) while in said normal latch operation, performing a latch write operation to the latch of at least one of the odd storage cells or even storage cells.

27. A method for scan test according to claim 26, further comprising sequentially shifting a latch state from a first of the storage cells though approximately M pairs of the storage cells, wherein M is an integer not exceeding N/2, each pair being any of an odd storage cell and its corresponding next even storage cell or an even storage cell and its corresponding next odd storage cell, by generating approximately M of said cycles of scan clock to repeat c) and d) approximately M times.

28. A method according to claim 27, further comprising the step of reading at least one of the N storage cells after at least one of the approximately M clock cycles.

29. A method according to claim 28, wherein said step of reading includes coupling at least one of the N readable one-bit storage cells to a port of a multiport register file.

30. A method according to claim 28, wherein said N storage cells are N readable one-bit storage cells of an N-bit register of a register file accessible via a port, and said step of reading includes coupling all N of said readable one-bit storage cells to the port.

31. A scannable register having a first latch having a latch input and a latch output and a second latch having a latch input and a latch output, comprising:

means for switching the first latch to a state corresponding to a given scan data, and latching the first latch at said state, wherein said means for switching and latching the first latch is configured to perform said switching by coupling said given scan data to the input of the first latch, and is configured to perform said latching by uncoupling said given scan data from the input of the first latch;

means for switching the second latch to said state, and latching the second latch at said state, wherein said means for switching and latching the second, latch is configured to perform said switching by coupling the output of the first latch while latched at said state to the input of the second latch, and to perform said latching by uncoupling the output of the first latch from the second latch, while said second latch is latched to said state; and means for writing the second latch to a given storage state while the latch input of the second latch is uncoupled from the latch output of the first latch.

32. A scannable register according to claim 31, wherein said uncoupling performed by said means for switching and latching the first latch at said state is performed substantially concurrent with said coupling performed by said means for switching and latching the second latch to said state of the first latch.

33. A scannable register according to claim 31, further comprising means for reading said state of the first latch while said first latch is latched at said state.

34. A scannable register according to claim 31, further comprising means for reading the said state of the second latch while said second latch is latched at said state.

35. A scannable register according to claim 34, wherein said means for reading couples at least one of the first and second latch to a port of a multiport register file.

36. A scannable register according to claim 31, wherein the scannable register is integrated in at least one semiconductor die.

37. A scannable register according to claim 36, further comprising a device, selected from the group consisting of a set top box, music player, video player, entertainment unit, navigation device, communication device, personal digital assistant (PDA), fixed location data unit, and a computer, into which the scannable register is integrated.

38. A scannable; N-bit register, comprising:

N one-bit storage cells, wherein N is an integer, each of the storage cells having a one-bit latch having a latch input and a latch output, arranged as approximately N/2 even storage cells and approximately N/2 odd storage cells, each even storage cell having a corresponding next odd storage cell from among said odd storage cells and each odd storage cell having a corresponding one next even storage cell from among said even storage cells;

means for generating a scan clock having repeating cycles, each cycle having a first clock event followed by a second clock event;

first shift means for receiving the scan clock and, in response to the first clock event of a scan clock cycle, coupling the latch output of each of the odd storage cells to the latch input of its corresponding next even storage cell to switch the state of the latch of its corresponding preceding next even storage cell to the state of the latch of the odd storage cell and, substantially concurrent with said coupling, uncoupling the latch output of each of the even storage cells from the latch input of its corresponding next odd storage cell to latch the state of the latch of said odd storage cell at the state of said latch prior to said uncoupling;

second shift means for receiving said scan clock and, in response to the second clock event of said scan clock cycle, uncoupling the latch output of each of the even storage cells from the latch input of its corresponding next odd storage cell to latch the state of the latch of each even storage cell its corresponding next odd storage cell to the state of the latch of the even storage cell and, substantially concurrent with said uncoupling, coupling the latch output of each of the odd storage cells to the latch input of its corresponding next even storage cell to switch the state of the latch said even storage cell to the state of the latch of said odd storage cell; and latch write means to write the latch of at least one even storage cell to a given storage state the input of said latch is uncoupled from the latch output of the odd storage cell for which said at least one even storage cell is the corresponding next even storage cell.

39. A scannable N-bit register according to claim 38, wherein, in response to receiving approximately M of said cycles of said scan clock, wherein M is an integer, said coupling and uncoupling performed by the first shift means and second shift means sequentially shifts a latch state from a first of the storage cells though approximately M pairs of the storage cells, each pair being any of an odd storage cell and its corresponding next even storage cell or an even storage cell and its corresponding next odd storage cell.

40. A scannable N-bit register according to claim 39, further comprising reading means for reading at least one of the N storage cells after at least one of the approximately M clock cycles.

41. A scannable N-bit register according to claim 40, wherein said reading means includes means for coupling at least one of the N readable one-bit storage cells to a port of a multiport register file.

42. A scannable N-bit register according to claim 38, wherein the scannable register is integrated in at least one semiconductor die.

43. A scannable N-bit register according to claim 42, further comprising a device, selected from the group consisting of a set top box, music player, video player, entertainment unit, navigation device, communication device, personal digital assistant (PDA), fixed location data unit, and a computer, into which the scannable N-bit register is integrated.

* * * * *